United States Patent [19]
Van Vechten

[11] 4,122,407
[45] Oct. 24, 1978

[54] HETEROSTRUCTURE JUNCTION LIGHT EMITTING OR RESPONDING OR MODULATING DEVICES

[75] Inventor: James Alden Van Vechten, Basking Ridge, N.J.

[73] Assignee: International Business Machines Corporation, Armonk, N.Y.

[21] Appl. No.: 674,190

[22] Filed: Apr. 6, 1976

[51] Int. Cl.² .................. H01S 3/19; H01L 27/14; H01L 29/04; H01L 27/14
[52] U.S. Cl. ........................ 331/94.5 H; 357/16; 357/17; 357/18; 357/30; 357/60
[58] Field of Search .............. 357/60, 16, 18, 30, 357/17; 331/94.5 H; 350/160 R; 156/612, 616 R, 616 A

[56] References Cited

U.S. PATENT DOCUMENTS

| | | | |
|---|---|---|---|
| 3,721,583 | 3/1973 | Blakeslee | 357/59 X |
| 3,950,195 | 4/1976 | Rode et al. | 148/171 |

OTHER PUBLICATIONS

D. L. Rode, "Crystal Growth Terraces and Surface Reconstruction" *J. of Crystal Growth* 27 (1974), pp. 313-315.
D. L. Rode, et al., "Growth of AlGaAs-GaAs Heterostructures from step-cooled Solutions", *J. of Crystal Growth* 29 (1975), pp. 61-64.

*Primary Examiner*—Stanley D. Miller, Jr.
*Assistant Examiner*—James W. Davie
*Attorney, Agent, or Firm*—Bernard N. Wiener

[57] ABSTRACT

Practice of this disclosure reduces the concentration of intrinsic defects heretofore grown into semiconducting materials. Thereby, the operational lifetime is increased of heterostructure junction light emitting or responding or modulating devices which are fabricated in accordance with principles of the disclosure. Illustratively, the operational lifetime of a heterostructure junction laser device thus fabricated is extended. This improvement in operational lifetime of the device is attained by constraining growth, e.g., liquid phase epitaxial growth, of the several layers of semiconducting materials which form such a device to proceed only upon unreconstructed surface layers. Illustratively, such an unreconstructed surface is any one of the set of (311) surfaces of a crystalline semiconductor having diamond, zinc-blende, or chalcopyrite structure. In particular, the operational lifetime of GaAlAs double heterostructure junction lasers is increased by constraining the liquid phase epitaxial growth to proceed only upon a (311B), i.e., an As terminated (311), surface so that respective interfaces between layers of the resultant devices are (311) crystal planes.

57 Claims, 15 Drawing Figures

HETEROSTRUCTURE JUNCTION LIGHT EMITTING OR RESPONDING OR MODULATING DEVICES

BACKGROUND OF THE INVENTION

It was shown by J. Willard Gibbs during the nineteenth century that it would not be possible to nucleate new growth on a perfectly flat surface of a solid by simple addition of atoms from a melt except under very high supercooling or supersaturation. Later, it was concluded by others that a perfect crystal can not grow at low supersaturation on singular surface such as the <100> surface of the gallium aluminum arsenide system. However, it is known that crystals of high macroscopic crystallographic perfecton actually do grow at low supersaturation on the <100> surface (as well as on other singular surfaces) of the gallium aluminum arsenide multicomponent system. In fact, the conventional method of growing a GaAs-GaAlAs double heterostructure junction laser makes use of a <100> oriented substrate to provide the growth axis for liquid phase epitaxy.

GaAs—GaAlAs double heterostructure laser thus grown by this conventional method contains a concentration of intrinsic nonradiative recombination centers which is greatly in excess of the thermodynamic equilibrium concentration under growth conditions. These defects cause the devices to degrade and fail in operation or when optically pumped. The devices grown in this way are observed to fail by growth of a "dark line defect" if the device contains a threading dislocation, or by growth of "dark spot defects" if the devices contains inclusions of aluminum oxide, graphite or other foreign matter. If neither of the above gross defects is present, the conventional devices degrade by becoming more or less uniformly dimmer.

Analysis of both short-time modes of failure shows that a concentration of nonradiative recombination centers of about $10^{19}/cm^3$ must exist in the active layer and/or in the p-type alloy layer in the as-grown device. Analysis of the thermodynamic properties of the materials under growth conditions shows that these nonradiative recombination centers are a complex of two arsenic vacancies and one aluminum antisite defect and that the actual concentration is about 100 times the equilibrium concentraton under growth conditions. Thus, although the crystalline layers are macroscopically perfect (i.e. smooth and free of defects visible under an optical microscope) they have a high density of defects on the atomic scale.

It was realized heretofore that there was a concentration of the particular nonradiative recombination center $V_{As}^{+1}Al_{As}^{-2}V_{As}^{+1}$ present in amounts more than 100 times the number that would be expected from equilibrium considerations.

The formation of darkline, DL, and darkspot, DS, defects are significant degradation short-time modes for GaAlAs double heterostructure lasers as summarized in the following literature articles:
  a. P. Petroff and R. L. Hartman, Appl. Phys. Lett. 23, 469 (1973)
  b. R. Ito, H. Nakashim, S. Kishino and O. Nakada, IEEE J. Quant. Elect. QE-11, 551 (1975)
  c. P. W. Hutchinson, P. W. Hutchinson, P. S. Dobson, S. O'Hara and D. H. Newman, Appl. Phys. Lett. 26, 250 (1975)
  d. J. A. Van Vechten, J. Electrochem, Soc. 122, 1556 (1975)

A review article of background interest for practice of this invention is "Heterostructure Junction Lasers" by M. B. Panish and I. Hayashi published on pages 235-328 in the book "APPLIED SOLID STATE SCIENCE, Vol. 4, Advances in Materials and Device Research", Academic Press, 1974.

The practice of this invention will be distinguished hereinafter from the disclosures of the following identified U.S. patents for which summary is presented:

I. U.S. Pat. No. 3,556,875, filed Jan. 3, 1967 by H. Holloway et al and issued January 1971 for "Process for Epitaxially Growing Gallium Arsenide on Germanium" discloses a method for the epitaxial growth from the vapor phase of device quality gallium arsenide on a monocrystalline germanium substrate having an exposed surface oriented between the (100) and the (111) crystal planes preferably at or between the (311) and (511) planes. It is stated therein that prior art methods have attempted to grow gallium arsenide on the (100), (111) and (110) crystal planes of a germanium substrate, and that crystals grown upon these planes have not been of device quality. That is, they are macroscopically imperfect.

II. U.S. Pat. No. 3,636,412, filed Dec. 23, 1968 by Y. Takeishi et al and issued Jan. 18, 1972 for "Oxide Coated Semiconductor Device Having [311] Planar Face" discloses a semiconductor device (for example, a planar transistor MOS-diode, or MOS-type field effect transistor) having a semiconductor substrate formed of a single crystal wherein the flat top surface of the substrate consists of a [311] crystal plane or one inclining to an extent of ±5° with respect to said [311] crystal plane. The orientation is chosen to maximize the speed of growth and/or etching.

The semiconductor substrate may consist of a single crystal semiconductor formed of a single element such as silicon or germanium, or compounds of Groups III and V. The semiconductor device is fabricated by forming layers on the lattice plane by means of a vapor phase or epitaxial growth method, diffusion method or alloying method and also by subjecting the substrate to various types of processing, for example, photographic etching, or chemical etching.

III. U.S. Pat. No. 3,721,583 filed Dec. 8, 1970 by A. E. Blakeslee and issued Mar. 20, 1973 for "Vapor Phase Epitaxial Deposition Process for Forming Superlattice Structure" discloses a vapor phase epitaxial process for forming a superlattice structure comprising alternate layers of different semiconductor materials on a substrate, in which superior macroscopic perfecton is obtained upon a (311) substrate. It is stated that $Ga_xAl_{1-x}As$ is one of the semiconductor systems which can be grown as epitaxial films and fashioned into superlattices in accordance with the invention.

It is stated that upon examining the product formed in accordance with an example of a wafer with a (100) orientation which had a curved edge, with an electron microscope, some deviations from a completely planar surface were observed. It was noted upon close examination that the epitaxial layers deposited around this curved edged contained a section with a much flatter superlattice structure than the remainder of the wafer. The orientation of this curved section was found to be very close to the (311) plane.

It is stated that, a wafer exactly as used in the noted example except with (311) orientation was substituted for the wafer and the process run repeated. The superlattice structure and the resultant layers are said to have turned out to be much flatter than those obtained in utilizing a (100) substrate, and that it was found to be possible to produce successive layers of extreme planarity.

CONSIDERATIONS FOR THE INVENTION

In the prior art, the epitaxial growth upon surfaces of the general class (N11) has been disclosed according to the noted U.S. Pat. Nos. 3,556,875, 3,636,421, and 3,721,583. However, growth proceeded from the vapor phase and not from the liquid phase as practiced according to the principles of this invention. Vapor phase epitaxial techniques have never produced semiconductor material of sufficient quality, in particular having a sufficiently low concentration of nonradiative recombination centers (NRC's) and consequently a sufficiently long carrier lifetime, to produce acceptable quality double or single heterostructure lasers or photovoltaic solar cells. Furthermore, the purpose of the noted patents is to attain material having macroscopically flat surfaces and interfaces between epitaxial layes of dissimilar material and having a low concentration of dislocations. These patents neither teach nor discover anything about the concentration of NRC's that might be present in material grown thereby relative to that grown upon surfaces of a different crystallographic orientation. The prior art of growth by liquid phase epitaxy upon a (100) oriented surface had overcome problems of attaining flat surfaces and interfaces with relatively dislocation free material, that was the object of the aforementioned patents, while exceeding the art of those patents in suppressing the concentration of nonradiative recombination centers (NRC's) and increasing carrier lifetimes.

Prior to the present invention, workers, in the prior art did not resort to liquid phase epitaxy upon a (311), (211) or (511) surface for the fabrication of heterostructure junction lasers because of the following considerations:

(1) no further improvement in interface flatness nor dislocation density was required nor was expected;

(2) greater difficulty in the formation of mirror surfaces at the ends of the laser and the separation of adjacent lasers on a wafer of material would ensue from the facts that GaAlAs can be cleaved only on (110) orientations and that there are four orientations perpendicular to a (100) surface but only two orientations perpendicular to an (N11) surface with $N \geq 2$;

(3) it is more difficult to prevent the catastrophic formation of facets of other crystalline orientations, in particular (111), (110), and (100), on an (n111) surface with $N \geq 2$ than on a (100) surface because the latter is singular while the former is not; and (4) the reduction in NRC concentration to be obtained by constraining the growth to proceed only upon an unreconstructed surface was not foreseen before the present invention.

Use of growth on (310) orientation to make heterostructure junction devices is an embodiment of this invention because (310) orientation does not reconstruct and the concentration of defects would be low. In the production of semiconductor injection lasers, it is necessary to produce two mirror planes which are parallel to each other and perpendicular to the junction. This is most conveniently done by cleaving. Cleaving can only be accomplished along <110> surfaces in the zinc-blende structure. As the <310> surfaces are not perpendicular to any <110> directions, the <310> surfaces cannot be used for this purpose if mirror planes are to be produced by the conventional cleavage method. However, somewhat satisfactoy mirror planes can be produced by polishing or other techniques for junction lasers grown on any orientation, including the class of (310) surfaces.

Material grown on the class of orientations including (310) expel dislocations from the growing surface during crystal boule growth by horizontal Bridgeman technique as disclosed in U.S. Pat. No. 3,520,810 for "Manufacture of Single Crystal Semiconductor", filed Jan. 15, 1968 by T. S. Plaskett et al and issued July 21, 1971. It discloses that GaAs injection lasers operate more efficiently and yield higher power outputs if single crystals of GaAs having a high degree of crystalline perfection (free of dislocations and defects resulting from chemical inhomogeneities) are used. It was found that the highest quality crystals were obtained when the GaAs crystals were doped with tin and grown from a GaAs seed oriented along the <031> direction.

The conventional method of growing a GaAs-GaAlAs double heterostructure laser by liquid phase epitaxy makes use of a <100> oriented substrate to provide the growth axis. Devices grown in this way are observed to fail by growth of a dark line defect if the device contains a threading dislocation, by growth of dark spot defects if inclusions of foreign matter are present, or by uniform dimming if neither is present. It was realized heretofore that there was a concentration of the particular nonradiative recombination center $V_{As}^{+1}Al_{As}^{-2}V_{As}^{+1}$ present in amounts more than 100 times the number that would be expected from equilibrium considerations.

Theoretical calculations have been made on thermochemical properties of defects in semiconducting materials with a view to identifying and understanding the NRC's (nonradiative recombination centers) capable of RED (recombination enhanced diffusion). It was concluded as set forth in literature reference article J. A. Van Vechten, J. Electrochem. Soc. 122, 1556 (1975) that the most important NRC capable of RED in GaAlAs alloy material is a complex of two As vacancies $V_{As}$ and one Al antisite defect $Al_{As}$, i.e., the complex $V_{As}^{+1}Al_{As}^{-2}V_{As}^{+1}$, which is the neutral state of the defect; it can also exist in several charged states. It was concluded in literature article by J. A. Van Vechten in "Proceedings of the International Workshop on the CdS/Cu$_2$S Solar Cell and Other Abrupt Heterojunctions" Newark, Del., NSF-RANN AER75-15858 (1975), page 191, that the most important NRC capable of RED in Cu$_2$S is a complex of two Cu vacancies and one S antisite defect. It was concluded that the most important NRC in GaP is a complex of two Ga vacancies and one P antisite defect in the literature articles J. A. Van Vechten, J. Electrochem. Soc., 122, 423 (1975), and J. A. Van Vechten, J. Electron. Mater. 4, 1159 (1975). There it was also predicted that this nonradiative recombination center (NRC) is capable of recombintion-enhanced diffusion (RED). That prediction was confirmed experimentally as reported in literature article by C. H. Henry, J. Electronic Mater. 4, 1037 (1975).

It is postulated for the practice of this invention that the source of the nonradiative recombination centers, NRC's, is the reconstruction of the (100) surface of the GaAlAs system during growth of the solid between the liquid and solid interface which is buried by subsequent growth of the solid system. It has been determined for the practice of this invention that the excess concentration of crystal defects over the equilibrium concentration, including the NRC's, is a result of the growth on a reconstructed surface. It has been shown for the practice of this invention that concentration of crystal defects over the thermodynamic equilibrium value is reduced several orders of magnitude by forcing crystal growth on an unreconstructed surface. Illustratively, the (311) surface of the GaAlAs system does not reconstruct during growth of the solid phase at a liquid-solid interface.

Because these dark line and dark spots defects consist of highly convoluted dislocation networks with correspondingly high dislocation line energy, it is concluded for the practice of this invention that they result from a precipitation of more elementary defects out of the bulk material. Because they grow only during operation or optical pumping, it is further concluded for the practice of this invention that these more elementary defects are nonradiative recombination centers, NRC's, capable of recombination enhanced diffusion. Because the DL defect extends over approximately $5 \times 10^8$ lattice sites, it is still further concluded for the practice of this invention that the concentration of NRC's in the initial material must be of the order of $10^{18}$ to $10^{19}/cm^3$. This concentration of NRC's is at least a factor of 100 greater than any reasonable estimate of the thermodynamic equilibrium concentration for the liquid phase epitaxing growth process employed.

It has been noted for the practice of this invention that surface reconstruction can cause the concentration of defects grown into semiconductors to exceed the equilibrium concentration by several orders of magnitude, as expressed in the literature article: J. A. Van-Vechten, J. Appl. Phys. 26, 593 (1975). This occurs because the reconstructed layer, which is noncommensurate with the bulk, is buried by the passage of growth steps during the growth process.

In fact, an excess concentration of defects will be found in most semiconductors grown with a low degree of supersaturation on a singular surface. Such a surface reconstructs to produce a surface layer that is in general incongruent with the bulk phase. As epitaxial growth proceeds, these surface layers are buried by the passage of growth steps. The resulting incorporation of these surface layers in the bulk then produces a concentration of defects in the bulk material which greatly exceeds the equilibrium value for the bulk-liquid system.

In the case of many III-V compounds including GaAs, AlAs and GaP, the surface layer has fewer atoms than a corresponding plane in the bulk phase. Hence under normal conditions of liquid phase epitaxial growth for which the melt is metal rich the excess defects trapped in the bulk phase will be nonmetal vacancies and metal anti-site defects. The subsequent migration of these defects is generally not sufficient to regain equilibrium between bulk and melt.

When GaAlAs double heterostructure lasers are grown by conventional technology, the actual concentration of As-vacancy-Al-antisite defect complexes, is much greater than the equilibrium concentration because, in the prior art, a reconstructing singular surface is used for the growth axis and a super-cooling of approximately one degree Kelvin is employed. The effect of the latter growth parameter is to cause the growth to proceed sufficiently slowly that each new surface layer produced by the passage of a growth-step will have time to undergo reconstruction to the incongruent reconstructed phase.

The <100> surface of GaAs is known to be highly singular from consideration of the bulk crystal structure, from the observation that this surface reconstructs, from measurements of vapor deposition growth rates, and from observations of the morphology of <100> vicinal surfaces, i.e., surfaces of the crystal which sometimes take the place of true <100> surfaces, after liquid or vapor phase epitaxial growth.

By applying nucleation theory, it has been postulated for the practice of this invention that a perfect singular surface cannot grow at all for a degree of supersaturation less than an amount corresponding to at least 20° Kelvin for GaAlAs alloy because no new growth-steps could be nucleated. Therefore, the only growth that can occur results from those nonequilibrium events which are sufficient to produce a growth-step. These events may include fluctuations in composition or temperature of the melt in contact with the crystal surface, nonuniform motion of the melt meniscus across the crystal surface, local cooling where the crystal touches the wall of the containing vessel, and the effect of the surface reconstruction itself.

Surface reconstruction produces growth steps when the reconstructed phase has a different atomic density than the corresponding layers of the bulk phase and the reaction propagates across the crystal surface driving a wave of atoms ahead of it. Where the waves of atoms from reactions initiating at different places on the crystal surface collide, a new growth-step will be produced. Whatever the source of the growth steps, the concentration of excess defects incorporated into the bulk phase will be proportional to the area of the incongruent, reconstructed surface layer that is buried by the subsequent rapid lateral propagation of the growth-step.

It was realized for the purpose of this invention that the source of the growth steps that account for the observed growth at low supersaturation on dislocation free, singlular (low index) surfaces of semiconductors must be the reconstruction reactions which proceed upon the treads of these steps, i.e., the nominal surface itself. When a first order reconstruction reaction occurs, the concentration of atoms in the reconstructed surface layer is, in general, different from, and usually is less than, that in an unconstructed layer of atoms at the surface produced by a simple truncation of the perfect bulk crystal structure.

The remedy for the foregoing identified deleterious situation, in accordance with the principles of this invention, is resort to a nonsingular, and therefore non-reconstructed, surface orientation to provide the surface upon which epitaxial growth is made to proceed. In order to attain a flat growing surface, and thus to attain flat interfaces between layers of dissimilar material for the heterostructure junction laser, it is necessary to choose an orientation having a local (but nonsingular) minimum of surface energy versus surface orientation. For the cases of GaAs, AlAs, GaAlAs alloys, and many other semiconductor compositions having the zinc-blende crystal structure, as well as those materials having the diamond or the chalcopyrite crystal structures, there are numerous orientations which fulfill this criterion including the classes of orientations (311), (211), (511), and (310).

Among the surface orientations which possess a local minimum of surface energy with respect to orientation, those which are singular (i.e., for which the surface energy as a function of orientation possesses a discontinuous derivative with respect to orientation) are most stable, i.e., the least apt to break up into facets of other, non-vicinal surfaces, during crystal growth or remelt, as explained in literature article by C. Herring in *Structure and Properties of Solid Surfaces* edited by G. Gomer and C. S. Smith (University of Chicago Press, Chicago, 1953), p. 5. In all cubic crystal structures, including the diamond, zinc-blende and chalcopyrite structures, the (111), (110), and (100) surfaces are all singular while (211), (311) and (511) surfaces are not.

It was concluded for the practice of this invention that, by constraining liquid phase epitaxial growth to proceed upon a surface of the general class (N11) with $N \geq 2$ and, in particular, of the class (311), (211), or (511), the interface between solid and liquid may be prevented from reconstructing, thereby eliminating the burying of reconstructed surface layers by the passage of growth steps during the growth process, and thereby achieving a concentration of intrinsic defects and, in particular of NRC's in the material thus fabricated which is near the thermodynamic equilibrium value and less than that in the prior art, which used surfaces that reconstruct, such as (100), by a factor of 100 or more.

It was concluded in the literature article by J. A. Van Vechten, J. Electrochem. Soc., 122, 423 (1975) that the most important NRC's (nonradiative recombination centers) in GaAs would be of the following identified two types: one type consisting of a complex of two Ga vacancies and one As antisite defect; and the other type consisting of two As vacancies and one Ga antisite defect, but that neither would be capable of RED to any appreciable extent. There is no known evidence for RED (radiation enhanced diffusion) of NRC's (nonradiative recombination centers) in GaAs radiation emitting or absorbing devices. Examination of GaAs by the direct lattice imaging technique of electron microscopy is reported in the literature article by J. B. Van der Sande and E. T. Perters, J. Appl. Phys. 24, 1298 (1974). That examination revealed NRC defects having the same shape, dimensions, orientation, and concentration as those deduced in literature article by J. A. Van Vechten, J. Electrochem. Soc., 122, 423 (1975).

The prior art workers, as described in the literature article by R. C. Sangster in *Compound Semiconductors* Vol. 1, edited by R. K. Willardson and H. L. Goering (Reinhold, New York 1962) page 241, had concluded that in semiconductors possessing diamond-type or zinc-blende-type crystal structures, surfaces of the general class (N11) with $N<2$, and all equivalent permutations, in particular, the set of surfaces (211), (311), and (511), which are composed of (111) and (100) steps in a more or less regular array with each step only a few atoms (less than 5) in width. There has not been a report in the literature of an observation of surface reconstruction on any surface of the general class (N11), with $N>2$, for any semiconductor possessing a crystal structure of the diamond-type, the zinc-blende-type or the chalcopyrite-type. However, it was known in the prior art that the class of (100) surfaces of GaAs and other semiconducting materials possessing the zinc-blende crystal structure do reconstruct, as described in the literature article by F. Jona, IBM J. Res. Develop. 9, 375 (1965).

OBJECTS OF THE INVENTION

It is an object of this invention to provide a crystalline solid-state device by epitaxial growth thereof on a non-reconstructed surface.

It is another object of this invention to provide a multilayer laser device of crystalline semiconductor material wherein confinement of lasing is to a layer as a result of internal total reflection at surfaces thereof.

It is another object of this invention to provide a crystalline semiconductor solid-state light emitting or responding or modulating device of cubic crystal structure which is grown on a (311) surface.

It is another object of this invention to provide a semiconductor laser device with a plurality of layers which have interfaces respectively therebetween having an epitaxial relationship at (311) surfaces.

It is an object of this invention to maximize carrier lifetimes and to minimize concentrations of intrinsic nonradiative recombination centers in those semiconductor materials to be employed in injection lasers, photovoltaic converters and solar cells, photodetectors, and optical modulators which materials are obtained by liquid phase epitaxial growth that is controlled by substrate orientation and temperature of the melt so that growth proceeds only upon sequential unreconstructed surface layers.

It is another object of this invention to provide an improved heterostructure junction device having a plurality of layers in which one layer is bounded by additional layers having wider band gaps than the bounded layer, said device having interfaces along one of the <311> surfaces of cubic crystalline material.

It is another object of this invention to minimize the concentration of nonradiative recombination centers by proper choice of the growth orientation during liquid phase epitaxial growth of a semiconductor multicomponent material.

SUMMARY OF THE INVENTION

Practice of this invention reduces the concentration of intrinsic defects heretofore grown into semiconducting materials. Thereby, the operational lifetime of heterostructure junction light emitting or responding or modulating devices which are fabricated in accordance with principles of the invention is increased.

Illustratively, the operational lifetime of a heterostructure junction laser device thus fabricated is extended by preventing the development of dark line defects and of dark spot defects, which are a primary cause of the short-time (e.g., 10 minutes to 200 hours) degradation and failure of such lasers, and by preventing other longer term degradation effects caused by the movement and concentration of non-radiative recombination centers. In devices which do not develope darkspot or dark-line defects, the long-time degradation by uniform dimming is slowed significantly. This improvement in operational lifetime of the device is attained by constraining growth, e.g., liquid phase epitaxial growth, of the several layers of semiconducting materials which form such a device to proceed only upon unreconstructed surface layers. Illustratively, such an unreconstructed surface is any one of the set of (311) surfaces of a crystalline semiconductor having diamond, zinc-blende, or chalcopyrite structure. Further, the wurtzite structure compounds, e.g., ZnO, CdS, BeO, ZnS and SiC, have such unreconstructed surfaces.

In particular, the operational lifetime of GaAlAs double heterostructure junction lasers is increased by constraining the liquid phase epitaxial growth to proceed only upon a (311B), i.e., an As terminated (311), surface so that respective interfaces between layers of the resultant devices are (311) crystal planes.

In greater generality, the practice of this invention provides improved light emitting devices, photovoltaic solar cells, and related devices in which the concentration of intrinsic defects, in particular of vacancy-antisite defect complexes, is lower by more than a factor of 100 than in exemplary devices fabricated using the prior art technology. These defects tend to cluster during the operation of a device and thereby form dark line defects and/or dark spot defects which cause the device either to fail or to degrade in operational performance. The reduction in the concentration of these vacancy-antisite defect complexes also improves the carrier lifetimes in the as-grown material and reduces the rate at which uniform dimming occurs in the long-time operation of devices which do not develope dark-line or dark-spot defects.

Growth surfaces for the practice of this invention have a local nonsingular minimum in surface energy per unit area versus orientation. Reduction of defect concentrations and improvement of device lifetimes in double heterostructure lasers is achieved for the practice of this invention by resort to a nonsingular, and hence nonreconstructed, surface for device growth. An especial growth axis for liquid phase epitaxial growth of GaAlAs heterostructure lasers is utilized for the practice of this invention to improve crystal growth kinetics and reduce the concentration of grown in defects and improve laser lifetimes.

In the case of injection lasers it is convenient to have the growth plane perpendicular to a (110) type direction so that cleaved facets can be formed. This imposes the additional constraint on the non-singular planes that these planes be of the form <N11> where N is 2 or greater. Among these surfaces the <211>, <311> and <511> have a local minimum in surface energy and appear to be optimum.

In particular, the choice of a <311> orientation for liquid phase epitaxy growth of GaAs—GaAlAs double heterostructure lasers by the practice of this invention results in nearly equilibrium growth of material and greatly reduces the concentration of nonradiative recombination centers in the devices.

When reference is made herein to a particular orientation, such as (311), all orientations related to it by symmetry operations of the crystal, such as (131) and (113), are intended to be included. When pairs of orientations are described, corresponding symmetry operations which leave the relative orientations unchanged may be applied.

The essence of this invention is an improvement in the process of liquid phase epitaxial growth of semiconducting material which provides a reduction therein of the concentration of intrinsic nonradiative recombination centers. Consequently there is an increase of carrier lifetime and of the operational lifetime of devices constructed from the improved material. This improvement is attained by constraining the growth to proceed only upon unreconstructed surface layers which is affected by orientation of the substrate surface and growth temperature and melt composition.

Through practice of the invention there is obtained a class of improved materials which may be used for the fabrication of improved classes of single and double heterostructure lasers, of solar energy collectors, of photovoltaic photodectors, and of optical modulators.

Through practice of the invention, there are obtained: a class of semiconductor devices containing one or more homojunction or heterojunction interfaces grown from a liquid by epitaxial growth on a surface which does not undergo reconstruction during the growth at successive crystal planes; such devices in which the interfaces are in nonsingular directions; such devices in which the interfaces are in directions with orientation <N11> where N is an integer greater than or equal to 2; such devices which generate light when an electric current is passed through them; and such devices which produce a current and voltage when light is incident upon them.

EMBODIMENTS OF THE INVENTION

The principles of this invention will be explained with reference in the first instance to FIGS. 1A, 1B and 1C which illustrate respectively: a heterojunction laser, a vacancy-antisite defect complex which acts as a nonradiative recombination center; and atomic configurations of several crystal surfaces for the zinc-blende crystal structure.

Figure 1A:
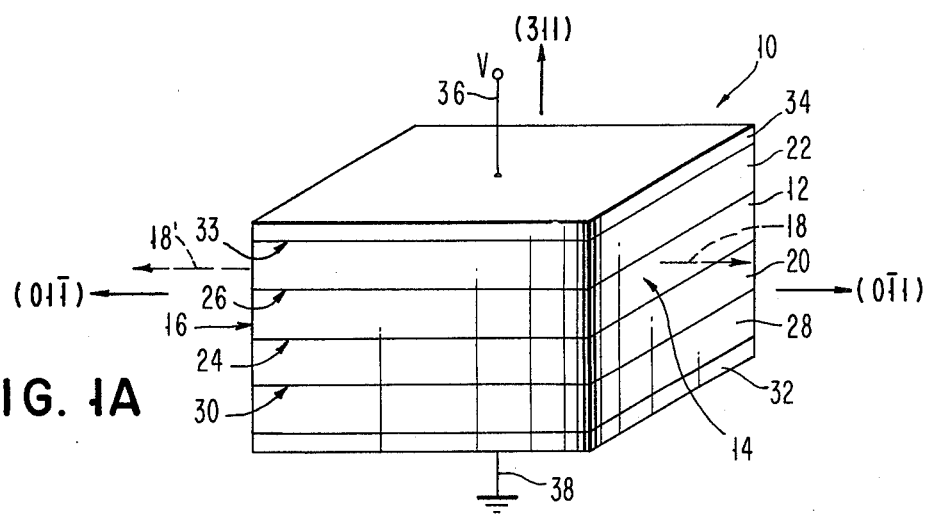
FIG. 1A is a schematic representation of an exemplary embodiment of a double heterostructure junction device from the GaAlAs multicomponent system in accordance with the principles of this invention.

Double heterojunction laser embodiment 10 of FIG. 1A comprises a plurality of semiconductor layers of which bounded layer 12 is the active lasing region and comprises p-type $Ga_{0.95}Al_{0.05}As$ with cleaved or polished faces 14 and 16 from which coherent light beams 18 and 18' are emitted respectively. These faces are (011) and (0$\bar{1}$1) faces respectively. The boundary layers 20 and 22 comprise n-type and p-type layers respectively of $Ga_{0.65}Al_{0.35}As$. The interfaces 24 and 26 between layers 20 and 12, and 22 and 12 respectively are $<311>$ planes in contradistinction to the comparable prior art embodiment which has $<100>$ plane thereat.

Further, for the exemplary embodiment of this invention illustrated schematically in FIG. 1A, a support and contact layer 28 is comprised of $n^+$ type GaAs and is bounded by layer 20 at interface 30 at a crystalline $<311>$ plane. Electrical contact 32 is established on GaAs layer 28 and serves as an electrically conductive layer for introducing current to the heterojunction device 10. The other electrode for the device 10 is electrically conductive layer 34 which is established on the top surface of boundary layer 22. In operation a voltage V is applied to lead wire 36. Electrons $e^-$ flow from metallic contact 32 to metallic contact 34 and, in the classical notation, current flows in via lead wire 36 and out via lead wire 38.

Figure 1B:
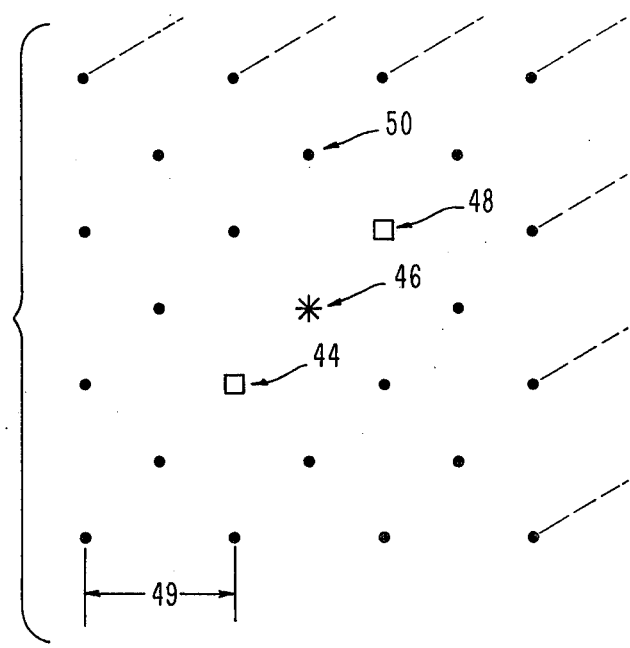
FIG. 1B is a diagrammatic representation of a cubic crystal lattice of the GaAlAs system showing an antisite defect complex consisting a two arsenic vacancies on either side of an Al atom on an As site; this complex is a nonradiative recombination center in a GaAlAs heterostructure laser.

FIG. 1B illustrates in schematic form the vacancy-antisite defect complex $V^+{}_{As}Al^{-2}{}_{As}V^+{}_{As}$ in the facecentered cubic, zinc-blende type lattice structure of the GaAlAs alloy system. The figure represents a (001) As sublattice plane of that crystal structure, normally containing As atoms 50. The vacancy-antisite complex extends in the (110) direction from an As vacancy at location 44 to an As vacancy at location 48. In the center of this defect complex is an Al antisite defect, i.e., an Al atom which is on an As sublattice site at location 46. The lattice constant dimension is denoted by 49. The vacancy complex has twelve potential orientations in the lattice, i.e., the set of equivalent $<110>$ directions and is a nonradiative recombination center. Such vacancy complexes occur in heterojunction lasers grown on the $<100>$ orientation in quantities exceeding the thermodynamic equilibrium value under growth condition. Such nonradiative recombination centers have contributed significantly to reduced lifetime under operational conditions for the prior art heterojunction lasers.

Figure 1C:
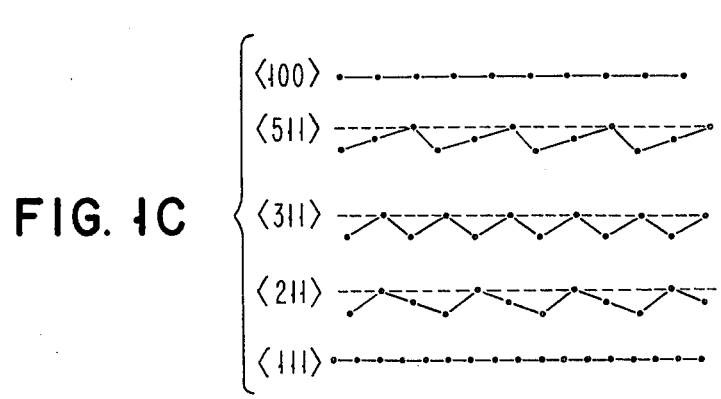
FIG. 1C is an idealized diagrammatic representation of the linear atomic configurations at the growth surface of a semiconductor for several surface orientations, showing that the singular surfaces such as (100) and (111) are flat whereas the nonsingular surfaces such as (211), (311) and (511) are step-like on an atomic scale.

Idealized linear configurations of atoms on the unreconstructed (111), (100), $<511>$, $<311>$ and $<211>$ surfaces of the zinc-blende type crystal structure of the GaAlAs alloy system are illustrated in FIG. 1C. The exemplary $<100>$ surface of this crystal structure will reconstruct in sufficient time during the growth of GaAs and of GaAlAs alloys and other similar semiconducting material from the liquid phase. However, the exemplary $<311>$ surface of this crystal structure will not reconstruct for these semiconducting materials in contact with the respective liquids from which they are grown. The $<100>$ and $<111>$ faces are smooth, while the $<211>$, $<311>$ and $<511>$ faces have a stepped structure on an atomic scale. These steps provide easy sites for atomic bonding during crystal growth, and inhibit surface reconstruction.

The origin of the excess concentration of the vacancy-antisite defect complex above the thermodynamic equilibrium value for a structure grown on the $<100>$ surface is the physical mechanism by which growth proceeds on such a surface after it has reconstructed. This mechanism involves the passage of a growth step across the reconstructed surface which buries the reconstructed surface under the growth step, thereby trapping defects into the bulk of the solid.

The use in accordance with the principles of this invention of a $<311>$ surface for the embodiment of FIG. 1A, or the use of another surface which does not reconstruct or reconstructs less rapidly than the $<100>$ surface, avoids this high density of trapped defects and leads to reduced operational degradation of the laser device.

Figure 1D:
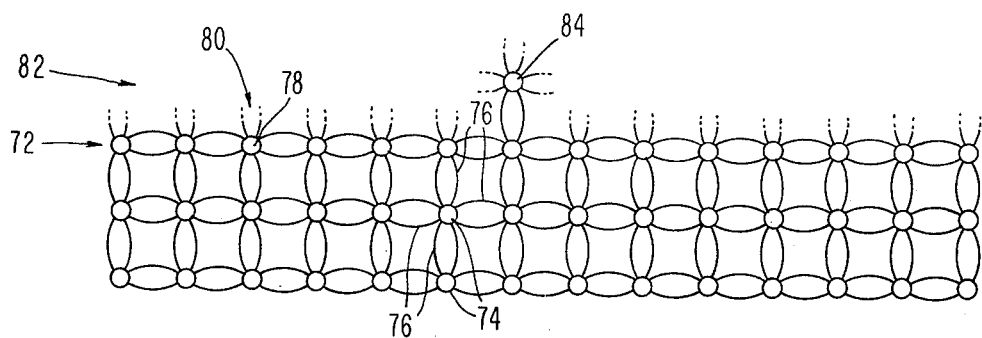
FIG. 1D shows a schematic representation of an unreconstructed singular surface of a semiconductor and illustrates the difficulty of attaching additional atoms to a completed surface layer.
Figure 1E:
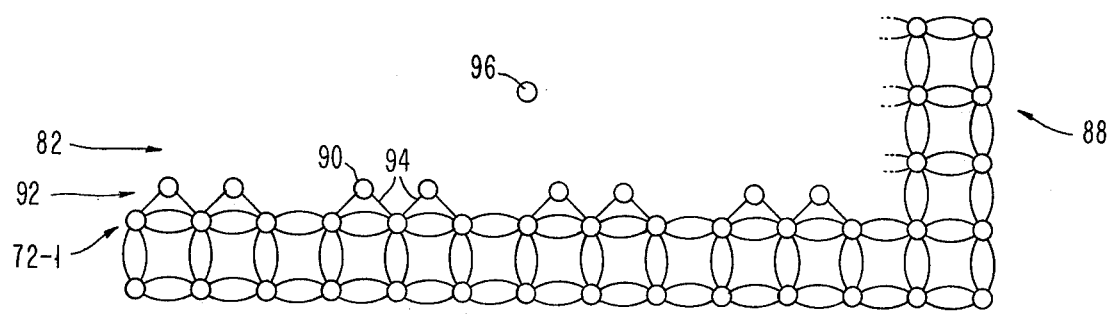
FIG. 1E shows a schematic representation of a partially reconstructed surface layer of a semiconductor, illustrating that the reconstructed surface layer has a lower atomic density than a corresponding layer in the bulk, and that the rapid formation of a growth step buries the vacancies associated with the reconstructed layer.

FIGS. 1D and 1E are line drawings for illustrating the physical mechanism of reconstruction and growth of a surface layer. FIG. 1D shows a two-dimensional schematic representation of an unreconstructed singular surface 72 of a semiconductor. Atoms 74 in the bulk of the crystal, below the surface, are bonded to neighbors by bonds 76. Atoms 78 in the last complete layer 72 have one broken bond 80 dangling into the phase 82 from which the crystal is growing. It is very difficult to nucleate new growth on such a completed, singular surface. If a new atom 84 tries to attach itself to such a surface, it could complete only one bond and would have its remaining bonds dangling into the phase 82 from which the crystal is growing. This is an energetically unfavorable configuration, and according to the principles of statistical thermodynamics, it is very unlikely to occur. The atom 84 is more likely to be detached from the surface and return to the phase 82. Growth is not expected to be nucleated by such a mechanism at low supersaturation according to established thermodynamic theory.

FIG. 1E shows a two-dimensional schematic representation of a semiconductor surface after reconstruction has occurred and a growth step 88 has formed. The atoms 90 on the reconstructed part of the surface, 92, have undergone a reaction which leaves them in a new configuration such that all their bonds 94 are complete. The reconstruction reaction lowers the energy of the surface layer and liberates heat. Because the concentration of surface atoms 90 in the reconstructed layer 92 is less than that in the unreconstructed layer 72 of FIG. 1D and unreconstructed layer 72-1 of FIG. 1E, the reconstruction reaction liberates atoms from the surface layer. A fraction of these liberated atoms 96 return to the phase 82 from which the crystal is growing. However, because of energetic considerations, this fraction is relatively small. Most of the liberated atoms migrate along the surface in a wave driven by the reconstruction reaction. Where wavefronts, beginning at various points on the unreconstructed surface, of such atoms driven by reconstruction reactions collide, they pile up and form a hillock. The hillock grows to become a set of growth steps 88 because atoms can attach at kink sites on the sides of such steps and hillocks without any nucleation problem. The growth step then grows rapidly and buries the reconstructed surface. This leads to a large concentration of vacancies and other defects in the grown crystal, because the buried reconstructed surface layer has fewer atoms than required to produce a perfect layer of the bulk crystal and because portions of the phase 82 from which the crystal is growing, which is generally noncongruent with the crystal, may be trapped between reconstructed surface 92 and the growth step 88.

Figure 2:
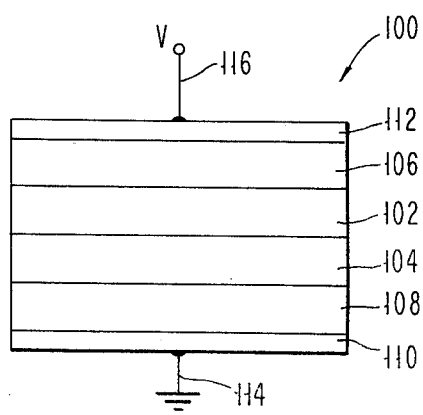
FIG. 2 is a schematic drawing of another GaAlAs heterostructure laser for illustrating the practice of this invention.

Another exemplary embodiment of this invention is presented in diagrammatical form in FIG. 2 wherein the embodiment 100 comprises the active layer 102 bounded by the bounding layers 104 and 106. The layers 102, 104 and 106 and the base 108 of the embodiment are from the GaAlAsP alloy system with the following identified general formulations with the indicated ranges.

TABLE I FOR EMBODIMENT 100 of FIG. 2

| | |
|---|---|
| | 106 $Ga_{x+z}Al_{1-x-z}As_{1-y}P_y$ |
| | 102 $Ga_xAl_{1-x}As_{1-t}P_t$ |
| | 104 $Ga_{x+y}Al_{1-x-y}As_{1-u}P_u$ |
| where | $0 \leq x \lesssim 0.4$ |
| | $0.15 \lesssim y \lesssim 0.45$ |
| | $0.15 \lesssim z \lesssim 0.45$ |
| | $0 \leq t \lesssim 0.2$ |
| | $0 \leq u \lesssim 0.2$ |
| | $0 \leq v \lesssim 0.2$ |
| | 108 $Ga_{1-m}Al_mAs_{1-n}P_n$ |
| where | $0 \leq m \leq 1$ and $0 \leq n \leq 1$ |

Metal contacts 110 and 112 complete the exemplary embodiment 100 for connection to external current source and sink via leads 114 and 116.

The practice of this invention relates to improvements in heterostructure light emitting devices as well as light responding devices, i.e., photovoltaic solar cells and photoconductors, wherein electromagnetic radiation is converted to electrical energy or vice versa. The practice of this invention involves fabrication of devices and the devices themselves, wherein structures are provided that have at least one active layer and one bounding or guiding layer adjacent thereto.

Other aspects of this invention will be examined through reference to FIGS. 3A, 3B, 3C, 3D, 3E and 3F which show several embodiments of this invention having various combinations of layers. The embodiments of FIG. 3 will be explained in the following Table II.

Table II for FIGS. 3A, 3B, 3C, 3D, 3E, and 3F

A = active layer wherein recombination is primarily to occur.

G = guiding or bounding layer which provides carrier injection, carrier confinement and/or optical confinement.

S = substrate semiconductor which provides growth starting surface and electrical contact.

C = capping layer semiconductor which provides protection and electrical contact.

M and M' = metal contact layers.

The generality of this invention will be further explained through reference to the following identified compositions for the active layer A and the guiding layer G of FIGS. 3A, 3B, 3C, 3D, 3E, and 3F:

$$A = a_{1-x}b_xc_{1-y}d_y$$

$$G = a_{1-x-v}b_{x+v}c_{1-y-u}d_{y+u}$$

where $a$ and $b$ are elements from groups IIIA or IIB or IB, and $c$ and $d$ are elements from group V or VI. Illustratively, for a III–V laser:

| | |
|---|---|
| a = Ga; | $0 \leq x \lesssim 0.4$ |
| b = Al; | $0.15 \lesssim v \lesssim 0.8$ |
| c = As; | $0 \leq y \lesssim 0.2$ |
| d = P; | $0 \leq u \lesssim 0.2$ |

Illustratively, for a IIB–VI laser:

| | |
|---|---|
| a = Hg; | $0.2 \lesssim x \lesssim 0.6$ |
| b = Cd; | $0.2 \lesssim v \lesssim 0.4$ |
| c = Te; | $0 \leq y \lesssim 0.2$ |
| d = Se; | $0 \leq u \lesssim 0.2$ |

CRITERIA FOR THE INVENTION

The criteria for the several layers for the homojunction or heterostructure light emitting or light responding or light modulating device, diode or laser in accordance with the principles of this invention will now be discussed with reference to FIGS. 3A, 3B, 3C, 3D, 3E and 3F. With regard to FIG. 3A, if the layer A has p-type conductivity, the guiding layer G has n-type conductivity. Alternatively, if the active layer A is n-type, the guiding layer G is p-type conductivity. The interface H between layers A and G is a <311> plane or other plane which does not reconstruct.

Practice of this invention is applicable to certain light emitting devices which are not laser devices or heterostructures per se. Illustratively, with regard to FIG. 3A, a single homojunction light emitting or light-responding device with the layer A being GaP (p-type) and with the layer G being GaP (n-type) is obtainable through the practice of this invention. The layers M and M' are metallic electrically conductive layers for making contact to the layers G and A respectively for communicating current to and from the device.

Figure 3A:
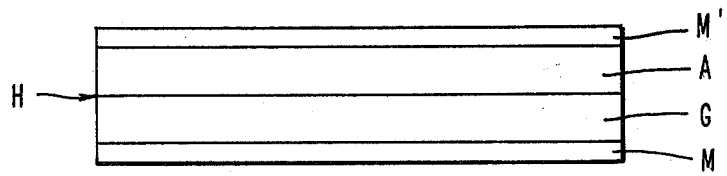
FIGS. 3A–3C are schematic representations of examples of p-n junction heterojunction or homojunction structures according to the principles of this invention.
Figure 3B:
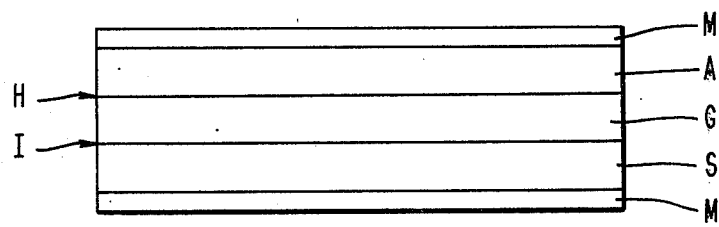

An additional layer is included in FIG. 3B, in comparison to the device of FIG. 3A, which is the substrate semiconductor layer S which has high conductivity and illustratively for a device based upon the GaAlAs system is conveniently n-type GaAs. A capping layer C is incorporated in the heterostructure device of FIG. 3C which has high conductivity and is a semiconductor of the same conductivity type as the active layer A.

Figure 3C:
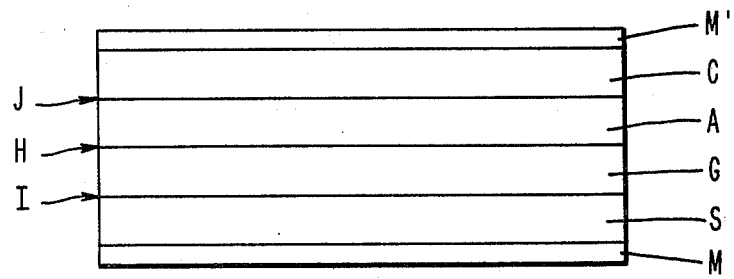

The homojunction and heterostructure devices examined with reference to FIGS. 3A, 3B, and 3C as above are single homojunction or heterojunction devices in accordance with the principles of this invention, with interfaces H, I, J oriented parallel to each other with directions leading to growth without reconstruction. Each device has only one p-n junction, However, several compositions within the various layers are permissible.

Figure 3D:
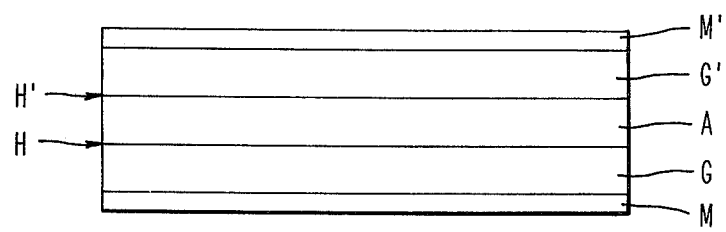
FIGS. 3D–3F are schematic representations of examples of heterostructure lasers or related devices according to the principles of this invention.
Figure 3E:
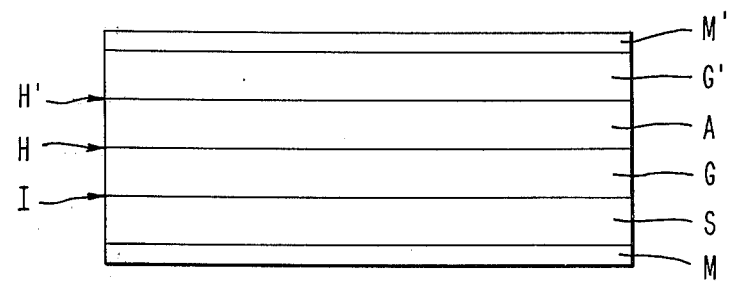
Figure 3F:
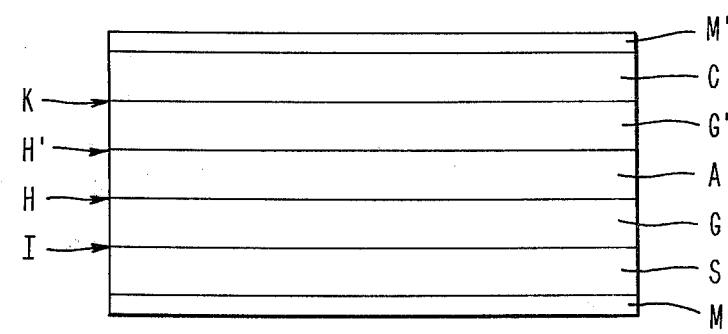

Double heterostructure devices in accordance with the principles of this invention will now be examined with reference to FIGS. 3D, 3E, and 3F. The guiding layer G' is comparable in composition, structure and purpose to the guiding layer G but of opposite conductivity type. As it is physically distinct from the guiding layer G, it may have different physical characteristics and be of different material composition.

The substrate layer S in FIGS. 3E and 3F, and the capping layer C in FIG. 3F are layers used for support and electrical contact, and are of the same electrical conductivity type as the adjoining layers G or G', respectively. The boundary surfaces H, H', I, and K in FIGS. 3D and 3F are along a <311> surface or other nonreconstructing surface.

Additional layers other than those described in FIGS. 3D, 3E, and may be used for fashioning the light-guiding and/or carrier confinement properties of heterostructure lasers. Illustrative examples are presented by H Kressel, in "*Laser Handbook,*" edited by F. T. Arecchi and E. O. Schulz-Dubois (North-Holland, Amsterdam, 1972), Vol. 1, pp. 441-495; or by Thompson et al in G. H. B. Thompson and P. A. Kirkby, IEEE J. Quant. Electron QE-9, 311 (1973). The improvements associated with nonreconstructing surfaces in accordance with the principles of this invention are applicable, to such structures as well as to those of FIGS. 3A-3F.

Layers G and G' should be of opposite conductivity type in order that there be only one p-n junction in the device. This must occur at one surface of bounded layer A.

The criteria for the confining or guiding layers G and G' are summarized below:

(1) The crystal structure and lattice constant of G and G' must match those of A as perfectly as possible. This is to minimize misfit dislocations and interface states both of which would produce nonradiative recombination of carriers if present.

(2) In order to attain optical confinement of the light generated by the laser, the index of refraction, of G or G', $N(G)$ or $N(G')$, must be less than that of A, $N(A)$. It is noted that $N(G)^2 = \epsilon(G)$, where $\epsilon(G)$ is the optical dielectric constant of G.

Figure 4A:
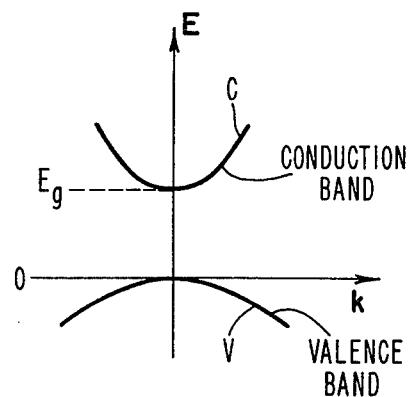
FIG. 4A is a schematic representation of the conduction and valence bands of a semiconductor with a direct band gap.
Figure 4B:
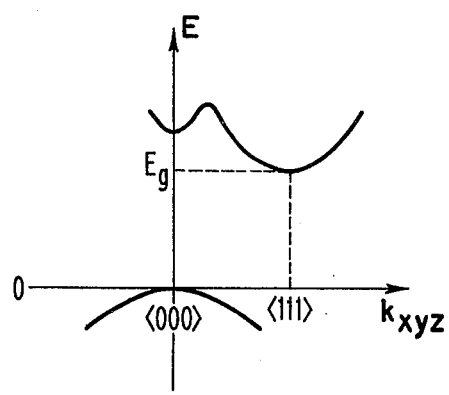
FIG. 4B is a schematic representation of the conduction and valence bands of a semiconductor with an indirect band gap.

The active layer is generally a direct bandgap semiconductor which will be discussed with reference to FIG. 4. FIG. 4A shows the band structure in a simplified energy-momentum diagram, where the valence band is shown as curve V and the conduction band is shown as curve C. Under the circumstance that the lowest energy state in the conduction band C is at the same crystal momentum as the peak in the valance band V, the semiconductor is a direct band gap semiconductor. In an indirect gap semiconductor as illustrated by FIG. 4B, the electrons at the bottom of the conduction band have a different crystal momentum, i.e., $k$, than the holes at the top of the valence band. Crystal momentum is conserved in optical dipole transitions. Therefore, electrons and holes can not recombine rapidly in an indirect semiconductor; they recombine by emission of phonons which take up the crystal momentum difference K. For this reason, only direct gap semiconductors in which electrons and holes recombine rapidly and without phonon emission will lase easily. Lasing has also been reported from impurity states in indirect band gap material. One example is GaP doped with N, for which lasing action on a N transition has been observed at low temperatures by N. Holonyak, Jr., D. R. Scifres, H. M. Macksey, and R. D. Dupuis, Appl. Phys. Lett. 20, 11 (1972).

Figure 4C:
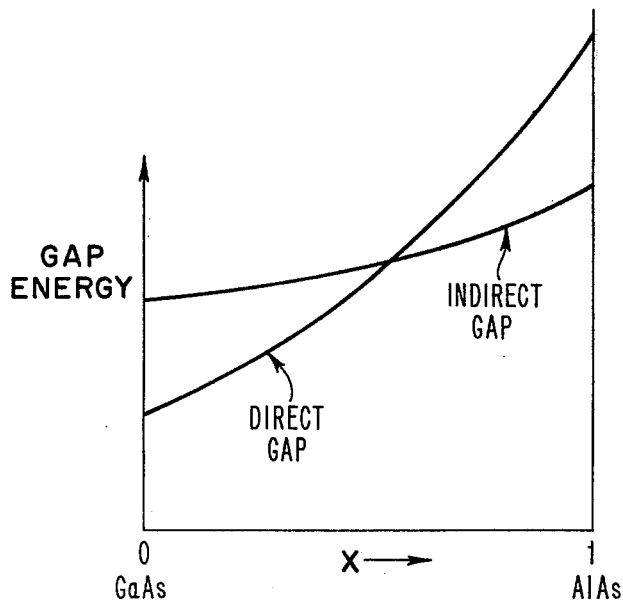
FIG. 4C is a schematic representation of the direct and indirect gaps of the $Ga_{1-x}Al_xAs$ alloy system as a function of the composition parameter x, showing the crossover from direct band gap to indirect band gap near $x \simeq 0.5$.

FIG. 4C shows the relationship between the direct and indirect gaps of $Ga_{1-x}Al_xAs$ and the molar fraction $x$ of AlAs in the alloy. For $x \lesssim 0.5$ the alloy has a direct band gap, and for $x \gtrsim 0.5$ the alloy has an indirect band gap.

PRACTICE OF THE INVENTION

Double heterostructure junction lasers fabricated by liquid phase epitaxy technique at slow and convenient rates of growth (less than 1 micron/per minute) upon surfaces of a (311B) orientation, did not develop any DLD's nor DSD's nor degrade in any fashion during operation, under operation conditions over periods exceeding 280 hours.

In contrast, GaAlAs double heterostructure junction lasers fabricated by liquid phase epitaxy at normal and convenient growth rates (less than 1 micron/per minute) upon surfaces of an orientation known to reconstruct, e.g., the (100) surface, were observed to develop DLD's and DSD's in times of operation less than 200 hours and more typically less than 10 hours.

In accordance with the principles of this invention, a $GaAs/Ga_{0.65}Al_{0.35}As/Ga_{0.90}Al_{0.10}As/Ga_{0.65}Al_{0.35}As/GaAs$ (as illustrated in FIG. 3F) n-p-p heterostructure wafer was grown by liquid phase epitaxy upon a polycrystalline GaAs substrate which had been lapped and etched to within 6° of the (311B) orientation. Twenty-four double heterostructure GaAlAs junction lasers were produced from this wafer. The apparatus employed for the liquid phase epitaxy is described in the literature article: K. K. Shih, G. R. Woolhouse, A. E. Blakeslee and J. M. Blum, Int. Phys. Conf. Ser. No. 24 (Institute of Physics, London, 1975) page 165.

Five melts were used which will be denoted melt 1 to melt 5. The compositions of the five melts were:

|        | Ga      | Al      | Dopant         | GaAs   |
|--------|---------|---------|----------------|--------|
| Melt 1 | 2.2 gm  | 0       | Sn: 99.29 mg   | Excess |
| Melt 2 | 2.05 gm | 2.77 mg | Sn: 100.81 mg  | Excess |
| Melt 3 | 2.2 gm  | 0.8 mg  | Si: 2.9 mg     | Excess |
| Melt 4 | 1.95 gm | 2.74 mg | Ge: 25.0 mg    | Excess |
| Melt 5 | 2.3 gm  | 0       | Ge: 21.15 mg   | Excess |

A predeposition substrate preceded the (311B) through the series of melts in order to partially equilibrate the melts to the semiconductor surfaces. This predeposition equilibration substrate was a standard lapped and etched <100> oriented GaAs wafer.

The Ga metal employed was etched in a solution of 2 parts $H_2O$ plus 1 part HCl until just prior to loading into the wells of the growth apparatus. The following series of crystal growth operations was then employed:

(1) heat apparatus to 850° C and hold for 3 hours;
(2) cool apparatus at 1° C per minute for 5 minutes to 845° C;
(3) advance predeposition wafer to melt and cool at 0.2° C/min for 20 minutes;
(4) advance (311B) substrate to melt 1 (predeposition wafer to melt 2) and cool for 40 mins. at 0.2° C/min.;
(5) advance (311B) substrate to melt 2 (predeposition wafer to melt 3) and cool for 30 min. at 0.2° C/min.;
(6) advance (311B) substrate to melt 3 (predeposition wafer to melt 4) and cool for 1 min. at 0.2° C/min.;
(7) advance (311B) substrate to melt 4 (predeposition wafer to melt 5) and cool for 15 min. at 0.2° C/min.;
(8) advance (311B) substrate to melt 5 and cool for 10 min. at 0.2° C/min.

By scanning electron microscopy it ws determined that the $Ga_{0.9}Al_{0.1}As$ active layer of the resulting heterostructure wafer was 0.8 microns thick. The subsequent processing of the wafer into strip geometry double heterostructure junction lasers 25 microns wide by 330 microns long with a 12 micron space between stripes employed the oxygen implantation process described in the literature article: J. M. Blum, J. C. McGroddy, P. C. McMullin, K. K. Shih, A. W. Smith, and J. F. Ziegler, IEEE J. Quantum Electron. *QE*-11, 413 (1975).

The mirror faces at the ends of the stripe geometry lasers were produced by the usual cleavage technique of the prior art. Some of the lasers were separated by a diamond grit string saw and some by an etching and cleaving technique in which all but the portions of the wafer where the cleave was to occur were covered with black wax etch resist. Grooves were etched into the wafer using a solution of equal parts $H_2O_2$, $NH_3OH$, and $H_2O$. Then, a blade was inserted into the resulting grooves and the wafer was cleaved. This etching and cleaving technique was preferable to the diamond string saw technique because the latter technique was found to cause damage extending as much as eight microns from the sawed edge into the laser material. This damage was particularly troublesome on the mirror faces where chips were observed to fall off producing a severe degradation in the efficiency of the device.

Twelve of the resulting lasers were provided with top electrical contacts. The contacts do not cover the active stripe and permit viewing of the spontaneous emission perpendicular to the layer with an infrared television camera. The as-grown lasers thus contacted were examined for the presence of the threading dislocation and "dirt" inclusion defects which almost always signify that lasers grown according to the prior art on the (100) orientation will develop DLD's or DSD's. Five of these lasers were observed to contain these defects. These five lasers were aged together with none lasers grown according to the prior art technique (on a (100) orientation) in the same apparatus immediately before and after the (311) lasers and processed according to the prior art technique noted above. The aging process lasted 283 hours. The ambient temperature was 30 degrees centigrade and the aging current was 500 milliamperes corresponding to a current density through the lasing stripe of about 6 kiloamperes/cm$^2$.

After this aging process all the lasers were again examined by spontaneous emission using the infrared television camera. None of the (311) lasers were observed to contain any DLD's or DSD's. They also showed some improvement in differential quantum efficiency. DLD's were observed in five of the nine (100) lasers. It was concluded from the observation of a substantial increase in lasing threshold and decrease in differential quantum efficiency of the other four (100) lasers that one contained a DLD or DSD which was obscured by the top contact. (Unlike the (311) lasers, the top contacts on the (100) lasers obscured about one third of the stripe.) Several others of the (311) lasers were aged under similar condition for periods exceeding 200 hours and no evidence for the formation of DLD's or DSD's was found.

In summary, the (311) lasers in accordance with the principles and practice of this invention showed significantly less degradation than comparable (100) units.

What is claimed is:

1. A single crystalline semiconductor heterostructure injection laser comprising:
   a monocrystalline substrate;
   an active layer of a first composition of single crystalline material, wherein radiative recombination of injected carriers primarily occurs;
   a carrier and light confining layer on one of the two sides respectively of said active layer, having a second compositin of single crystalline material, the respective interface between each confining layer and the active layer being a crystalline plane which does not reconstruct;
   an additional single crystal transition layer adjacent to said confining layer, the planar interface therebetween being a crystalline plane which does not reconstruct, the several said layers being disposed in epitaxial relationship from said monocrystalline substrate which is so oriented that its normal surface on which the several said layers are disposed in epitaxial relationship is a non-reconstructing crystalline surface;
   electrical contact means for causing suitable injection current of electrons and holes to be injected into the active layer to produce recombination therein; and
   feedback means to produce laser oscillations in the structure when an injection current exceeding a threshold is applied thereto.

2. A laser as set forth in claim 1 wherein said feedback means includes mirror surfaces.

3. A semiconductor heterostructure light emitting device comprising:
   a single crystalline substrate of a first composition and conductivity type;
   an epitaxially related single crystalline layer of composition different from said first composition disposed an said substrate with planar interfaces therebetween,
   said planar interfaces between the single crystalline layers being non-reconstructing planes;
   a p-n junction formed by two of said layers and said substrate which provides injected minority carriers in order to produce radiative recombination in said device; and
   electrical contact means for providing a suitable current of injected carriers to sustain the radiative recombination.

4. The heterostructure light emitting device of claim 3 wherein the compositions chosen have the diamond, zinc-blende or chalcopyrite structure.

5. The heterostructure light emitting device of claim 4 wherein said interfaces are of the form <N11> with N at least 2.

6. The heterostructure light emitting diode of claim 5 wherein the interfaces are <311> interfaces.

7. The semiconductor heterostructure light emitting device of claim 4 wherein the interfaces are <310>.

8. A semiconductor heterostructure photovoltaic converter comprising:
   a single crystalline substrate of a first composition and conductivity type;
   an epitaxially related single crystalline layer disposed on said substrate of composition different from said first composition with a planar interface respectively therebetween,
   the planar interface between the single crystalline layers being a non-reconstructing plane;
   at least one of the said layers being of opposite conductivity type from said substrate to provide voltage and current generating means when light is incident on the layers; and
   electrical contact means for connecting the generated voltage and current to an external circuit.

9. The heterostructure photovoltaic converter of claim 8 wherein the compositions chosen have the diamond, zinc-blende or chalcopyrite structure.

10. The heterostructure photovoltaic converter of claim 9 wherein said interfaces are of the form <N11> with N at least 2.

11. The heterostructure photovoltaic converter of claim 10 wherein the interfaces are <211> interfaces.

12. The semiconductor heterostructure photovoltaic converter of claim 9 wherein the interfaces are <310>.

13. Heterostructure junction device, comprising:
a single crystalline substrate layer;
an active layer supported by said substrate having single crystalline structure with oppositely disposed parallel end faces which are each at least partially reflective at light, wherein carrier recombination primarily occurs in said device, and having first composition from a semiconductor multicomponent system of a given conductivity type;
a first boundary layer having single crystalline structure on one side of said active layer and forming a first interface therewith of crystalline orientation which has a nonsingular local minimum value of the surface energy per unit area, for carrier injection and carrier confinement and for optical confinement in said active layer, and having second composition different than said first composition of opposite conductivity type than said active layer from said semiconductor multicomponent system; and
first electrical contact means for said active layer, and
second electrical contact means for said boundary layer, for communicating current to and from said device.

14. Heterostructure junction device as set forth in claim 13 which is a light emitting laser.

15. Heterostructure junction device as set forth in claim 13 wherein
said active layer and said first boundary layer are single crystalline cubic structure, and
said first interface is selected from the class of crystal surface $<N11>$ where N is at least 2.

16. Heterostructure junction device as set forth in claim 15 wherein said selected interface is $<311>$.

17. Heterostructure junction device as set forth in claim 16 having diamond, zinc-blende or chalcopyrite structure.

18. Heterostructure junction device as set forth in claim 17 wherein
said active layer has the composition
$A = a_{1-x}b_x c_{1-y}d_y$, and said first boundary layer has the composition
$6 = a_{1-x-\nu}b_{x+\nu}c_{1-y-u}d_{y+u}$, where $a$ and $b$ are elements from group IIIA, $c$ and $d$ are elements from group V and wherein:
$a = $ Ga,
$b = $ Al,
$c = $ As,
$d = $ P; and
$0 \leq x \lesssim 0.4$,
$0.15 \lesssim \nu \lesssim 0.8$,
$0 \leq y \lesssim 0.2$,
$0 \leq u \lesssim 0.2$.

19. Heterostructure junction device as set forth in claim 17 wherein
said active layer has the composition $A = a_{1-x}b_x c_{1-y}d_y$, and said first boundary layer has the composition
$G = a_{1-x-\nu}b_{x+\nu}c_{1-y-u}d_{y+u}$, where $a$ and $b$ are elements from group IIB, $c$ and $d$ are elements from group VI and wherein:
$a = $ Hg,
$b = $ Cd,
$c = $ Te,
$d = $ Se; and
$0.2 \lesssim x \lesssim 0.6$,
$0.2 \lesssim \nu \lesssim 0.4$,
$0 \lesssim y \lesssim 0.2$,
$0 \lesssim u \lesssim 0.2$.

20. Heterostructure junction device as set forth in claim 13 wherein there is included voltage means connected to said first electrical contact means and said second electrical contact means for establishing current in said device.

21. Heterostructure junction device as set forth in claim 13 wherein there is included as part of said first electrical contact means
a second boundary layer having single crystalline structure on the other side of said active layer and forming a second interface therewith of crystalline orientation which has a nonsingular local minimum value of the surface energy per unit area, for carrier injection and carrier confinement and for optical confinement in said active layer, having third composition of same conductivity type as said active layer from said semiconductor multicomponent system.

22. Heterostructure junction device as set forth in claim 21 wherein
said first and second interfaces consist of an interface selected from the class of intefaces $<N11>$ where N is at least 2.

23. Heterostructure junction device as set forth in claim 21 having diamond, zinc-blende or chalcopyrite structure.

24. Heterostructure junction device as set forth in claim 23 wherein said selected interface is $<311>$.

25. Heterostructure junction device as set forth in claim 24 wherein
said active layer has the composition $Ga_x Al_{1-x} As_{1-t}P_t$,
said first boundary layer has the composition
$Ga_{x+y}Al_{1-x-y}As_{1-u}P_u$, and said second boundary layer has the composition
$Ga_{x+z}Al_{1-x-z}As_{1-\nu}P_\nu$, wherein:

$0 \leq x \lesssim 0.4$, $0.15 \lesssim y \lesssim 0.45$, $0.15 \lesssim z \lesssim 0.45$, $0 \leq t \lesssim 0.2$, $0 \leq u \lesssim 0.2$, and
$0 \leq \nu \lesssim 0.2$.

26. Heterostructure junction device as set forth in claim 21 wherein said second electrical contact means for said first boundary layer includes
a substrate layer on said first boundary layer on the side thereof opposite from said active layer having fourth composition of same conductivity type as said active layer from said semiconductor multicomponent system.

27. Heterostructure device as set forth in claim 26 wherein said substrate layer is single crystalline structure and forms a third interface with said first boundary layer of crystalline orientation which has a nonsingular local minimum value of the surface energy per unit area.

28. Heterostructure junction device as set forth in claim 27 wherein
said first, second and third interfaces consist of an interface selected from the class of interfaces <N11>, where N is at least 2.

29. Heterostructure junction device as set forth in claim 28 wherein said selected interface is <311>.

30. Heterostructure junction device as set forth in claim 29 having diamond, zinc-blende or chalcopyrite structure.

31. Heterostructure junction device as set forth in claim 27 wherein
said active layer has composition $Ga_xAl_{1-x}As_{1-t}P_t$, said first boundary layer has composition $Ga_{x+y}Al_{1-x-y}As_{1-u}P_u$, said second boundary layer has composition
$Ga_{x+z}Al_{1-x-z}As_{1-v}P_v$, and substrate layer has composition $Ga_{1-m}Al_mAs_{1-n}P_n$, wherein:

$0 \leq x \lesssim 0.4$, $0.15 \lesssim y \lesssim 0.45$, $0.15 \lesssim z \lesssim 0.45$, $0 \leq t \lesssim 0.2$, $0 \leq u \lesssim 0.2$, $0 \leq v \lesssim 0.2$, $0 \leq m \leq 1$, and $0 \leq n \leq 1$.

32. Heterostructure junction device as set forth in claim 21 wherein said first electrical contact means for said active layer further includes
a capping layer on said second boundary layer having fifth composition from said semiconductor multicomponent system for environmentally protecting and electrically contacting said second boundary layer.

33. Heterostructure junction device as set forth in claim 32 wherein said capping layer is single crystalline structure and forms a fourth interface with said second boundary layer of crystalline orientation which has a nonsingular local minimum value of the surface energy per unit area.

34. Heterostructure junction device as set forth in claim 33 wherein said first, second, third, fourth and fifth interfaces consist of an interface selected from the class <N11> where N is greater than 2.

35. Heterostructure junction device as set forth in claim 34 wherein said selected interface is <311>.

36. Heterostructure junction device as set forth in claim 35 having diamond, zinc-blende or chalcopyrite structure.

37. Heterostructure junction device as set forth in claim 36 wherein said capping layer has composition $Ga_{1-m}Al_mAs_{1-n}P_n$ where m and n are less than or equal to 1.

38. Heterostructure junction device as set forth in claim 32 wherein said first electrical contact means and said second electrical contact means include respectively
a metallic layer on said capping layer, and
a metallic layer on said substrate layer.

39. Heterostructure junction device as set forth in claim 38 wherein there is included
voltage means connected to said first electrical contact means and said second electrical contact means for establishing current in said device.

40. Heterostructure junction device as set forth in claim 13 wherein said first electrical contact means and said second electrical contact means include respectively
a second boundary layer on the other side of said active layer and forming a second interface therewith of crystalline orientation which has a nonsingular local minimum value of the surface energy per unit area, for carrier injection and carrier confinement and for optical confinement in said active layer, and having second composition different than said first composition of opposite conductivity type than said active layer from said semiconductor multicomponent system
a metallic layer on said second boundary layer, and
a metallic layer on said first boundary layer.

41. Heterostructure junction device as set forth in claim 40 wherein there is included voltage means connected to said first electrical contact means and said second electrical contact means for establishing current in said device.

42. Heterostructure junction device as set forth in claim 13 wherein said first electrical contact means and said second electrical contact means include respectively
a second boundary layer on the other side of said active layer and forming a second interface therewith of crystalline orientation which has a nonsingular local minimum value of the surface energy per unit area, for carrier injection and carrier confinement and for optical confinement in said active layer, and having second composition different than said first composition of opposite conductivity type than said active layer from said semiconductor multicomponent system
a metallic layer on said second boundary layer, and
a metallic layer on said substrate layer.

43. Heterostructure junction device as set forth in claim 42 wherein there is included voltage means connected to said first electrical contact means and said second electrical contact means for establishing current in said device.

44. A device comprising:
a single crystalline substrate
a p-type semiconductor layer and an n-type semiconductor layer forming one semiconductor p-n junction therebetween;
means for conducting electricity to and from both the p-type and the n-type semiconducting layers via metallic conductors;
means for passing light in or out of said p-n junction; and
a plurality of semiconducting layers on said substrate disposed in epitaxial relationship, including those two which form the p-n junction, bounded by planes all approximately parallel to one another and oriented in a crystalline direction corresponding to a nonsingular local minimum of the surface energy per unit area as a function of orientation for the semiconducting materials employed.

45. A device as set forth in claim 44 which is a light emitting device.

46. A semiconductor device as set forth in claim 44 wherein radiative recombination of injected minority carriers occurs primarily in one of said p-type and said n-type semiconductor layers, said one semiconductor layer being denoted as the active layer.

47. A semiconductor device as set forth in claim 46 wherein the layer on the opposite side of the p-n junction from said active layer is of a composition having a larger fundamental band gap and lower optical index of refraction than that of the active layer so that the benefits of the reflection both of carriers and of emitted light back into said active layer from the p-n junction are obtained.

48. A semiconductor device as set forth in claim 46 wherein the layers on both sides of said active layer are of compositions having larger fundamental band gaps and lower optical indexes of refraction than that of the active layer so that the benefits of the reflection both of carriers and of emitted light back into the active layer from the layers on either side, are obtained.

49. A semiconductor double heterostructure optical modulator device as set forth in claim 44 employing the electrooptic effect under reverse bias of said p-n junction wherein one of the layers meeting at said p-n junction, which is denoted the guiding layer, is composed of material having a larger optical index of refraction than both layers on either side of said guiding layer, these two layers being denoted the confining layers, so that light entering said device through facets perpendicular to the planes bonunding said layers is confined by total internal reflection to the guiding layer and may have its axis of polarization rotated by application of said reverse bias voltage to said p-n junction through the action of said electrooptic effect.

50. A device as set forth in claim 49 said facets are cleaved.

51. A semiconductor light responding device as set forth in claim 44 wherein light is caused to pass through said semiconducting layers and one of the two electrical contacts to said p-n junction with a component at approximately normal incidence so that electron-hole pairs created by the absorption of said light in the region of said p-n junction are separated to either side of said junction and conducted away from said device via said electrical conductors as a photoinduced electrical current.

52. A light responding device as set forth in claim 51 wherein said device is a photovoltaic device.

53. A light responding device as set forth in claim 51 which is a photovoltaic device.

54. A light responding device as set forth in claim 51 which is a solar cell.

55. A light responding device as set forth in claim 51 is a photodetector device.

56. A device as set forth in claim 44 which is a light responding device.

57. A device as set forth in claim 44 which is a light modulating device.

* * * * *